(12) United States Patent
Cousinard et al.

(10) Patent No.: US 10,135,409 B1
(45) Date of Patent: Nov. 20, 2018

(54) HIGH-EFFICIENCY RF DIGITAL POWER AMPLIFIER WITH JOINT DUTY-CYCLE/AMPLITUDE MODULATION

(71) Applicant: Marvell International Ltd., Hamilton (BM)

(72) Inventors: David Cousinard, Morges (CH); Renaldi Winoto, Los Gatos, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 15/420,109

(22) Filed: Jan. 31, 2017

Related U.S. Application Data

(60) Provisional application No. 62/290,025, filed on Feb. 2, 2016, provisional application No. 62/450,293, filed on Jan. 25, 2017.

(51) Int. Cl.
*H03F 3/217* (2006.01)
*H03F 3/195* (2006.01)

(52) U.S. Cl.
CPC .......... *H03F 3/2178* (2013.01); *H03F 3/195* (2013.01); *H03F 3/217* (2013.01); *H03F 3/2171* (2013.01); *H03F 3/2173* (2013.01); *H03F 2200/339* (2013.01); *H03F 2200/351* (2013.01); *H03F 2200/387* (2013.01); *H03F 2200/432* (2013.01); *H03F 2200/451* (2013.01)

(58) Field of Classification Search
CPC ...... H03F 3/2178; H03F 3/195; H03F 1/0277; H03F 1/56; H03F 3/193; H03F 3/211; H03F 3/245; H03F 3/72; H03F 1/0294; H03F 3/2175; H03F 3/19; H03F 3/602; H03M 1/74; H04L 27/04

USPC .......... 330/124 R, 207 A, 251, 295
See application file for complete search history.

(56) References Cited

U.S. PATENT DOCUMENTS

| | | | | |
|---|---|---|---|---|
| 6,819,171 B2 * | 11/2004 | Kenington | ............ | H03F 1/0294 330/124 D |
| 6,891,432 B2 * | 5/2005 | Nagle | .................... | H03F 1/0277 327/359 |
| 7,091,778 B2 * | 8/2006 | Gan | ...................... | H03F 1/0211 330/124 R |

(Continued)

OTHER PUBLICATIONS

Cusinard et al., "A 0.23mm2 digital power amplifier with hybrid time/amplitude control achieving 22.5dBm at 28% PAE for 802.11g", 2017 IEEE International Solid-State Circuits Conference, Session 13 (Hight-Performance Transmitters), pp. 21-23, Feb. 5-9, 2017.

*Primary Examiner* — Khanh V Nguyen

(57) ABSTRACT

A power amplifier includes an array of transistors having outputs that are connected in parallel to one another and coupled to an output network. The power amplifier further includes digital circuitry, configured to receive a sequence of control words that specify respective amplitudes of a signal to be transmitted in respective time intervals, and to transmit the signal by performing, for each control word and respective time interval: partitioning the control word into a Least Significant Bit (LSB) portion and a Most Significant Bit (MSB) portion; selecting a time duration based on the LSB portion; selecting an amplitude based on the MSB portion; and activating the array of transistors during the time interval in accordance with the selected time duration and the selected amplitude.

14 Claims, 3 Drawing Sheets

(56) References Cited

U.S. PATENT DOCUMENTS

| | | | |
|---|---|---|---|
| 7,298,854 B2 * | 11/2007 | Ahmed | H03H 17/0202 |
| | | | 381/94.1 |
| 7,880,542 B1 * | 2/2011 | Gilbert | H03F 1/0277 |
| | | | 330/127 |
| 8,138,829 B2 * | 3/2012 | Reddy | H03F 1/0277 |
| | | | 330/124 R |
| 9,755,600 B1 * | 9/2017 | Turker Melek | H03G 1/0029 |
| 2008/0290938 A1 * | 11/2008 | Gupta | H03F 3/2178 |
| | | | 330/127 |

* cited by examiner

HIGH-EFFICIENCY RF DIGITAL POWER AMPLIFIER WITH JOINT DUTY-CYCLE/AMPLITUDE MODULATION

CROSS-REFERENCE TO RELATED APPLICATIONS

This application claims the benefit of U.S. Provisional Patent Application 62/290,025, filed Feb. 2, 2016, and U.S. Provisional Patent Application 62/450,293, filed Jan. 25, 2017, whose disclosures are incorporated herein by reference.

FIELD OF THE DISCLOSURE

The present disclosure relates generally to Radio Frequency (RF) transmission, and particularly to methods and systems for power amplification.

BACKGROUND

Some types of Power Amplifiers (PAs) utilize power transistors that operate as switches, e.g., in Class D, E or F. The input signal is provided to such amplifiers as a series of pulses that cause the transistors to switch rapidly between conduction and cutoff. Pas of this sort are sometimes referred to as Digital PAs (PAs).

The description above is presented as a general overview of related art in this field and should not be construed as an admission that any of the information it contains constitutes prior art against the present patent application.

SUMMARY

An embodiment that is described herein provides a power amplifier including an array of transistors having outputs that are connected in parallel to one another and coupled to an output network. The power amplifier further includes digital circuitry, configured to receive a sequence of control words that specify respective amplitudes of a signal to be transmitted in respective time intervals, and to transmit the signal by performing, for each control word and respective time interval: partitioning the control word into a Least Significant Bit (LSB) portion and a Most Significant Bit (MSB) portion; selecting a time duration based on the LSB portion; selecting an amplitude based on the MSB portion; and activating the array of transistors during the time interval in accordance with the selected time duration and the selected amplitude.

In some embodiments, the digital circuitry is configured to select the amplitude by selecting a number of the transistors to be activated, and to activate only the selected number of the transistors during at least part of the time interval. In an embodiment, within the time interval, the digital circuitry is configured to activate only the selected number of the transistors for a first time period having a fixed time duration, and to activate all the transistors for a second time period having the selected time duration. In an example embodiment, the digital circuitry is configured to schedule each second time period to end in accordance with a clock signal, and to schedule each first time period to immediately precede the corresponding second time period.

In some embodiments, the digital circuitry is configured to select the time duration by selecting a pair of clock signals from among a plurality of clock signals. In a disclosed embodiment, the digital circuitry is configured to apply the selected amplitude while a single clock signal in the pair is asserted, and to apply the selected time duration while both clock signals in the pair are asserted. In an embodiment, the digital circuitry is configured to deactivate the array of transistors for an intermediate idle period between successive time intervals.

There is additionally provided, in accordance with an embodiment that is described herein, a method for power amplification including receiving a sequence of control words, which specify respective amplitudes of a signal to be transmitted in respective time intervals by an array of transistors having outputs that are connected in parallel to one another and coupled to an output network. The signal is transmitted by performing, for each control word and respective time interval: partitioning the control word into a Least Significant Bit (LSB) portion and a Most Significant Bit (MSB) portion; selecting a time duration based on the LSB portion; selecting an amplitude based on the MSB portion; and activating the array of transistors during the time interval in accordance with the selected time duration and the selected amplitude.

The present disclosure will be more fully understood from the following detailed description of the embodiments thereof, taken together with the drawings in which:

DETAILED DESCRIPTION OF EMBODIMENTS

Figure 1:
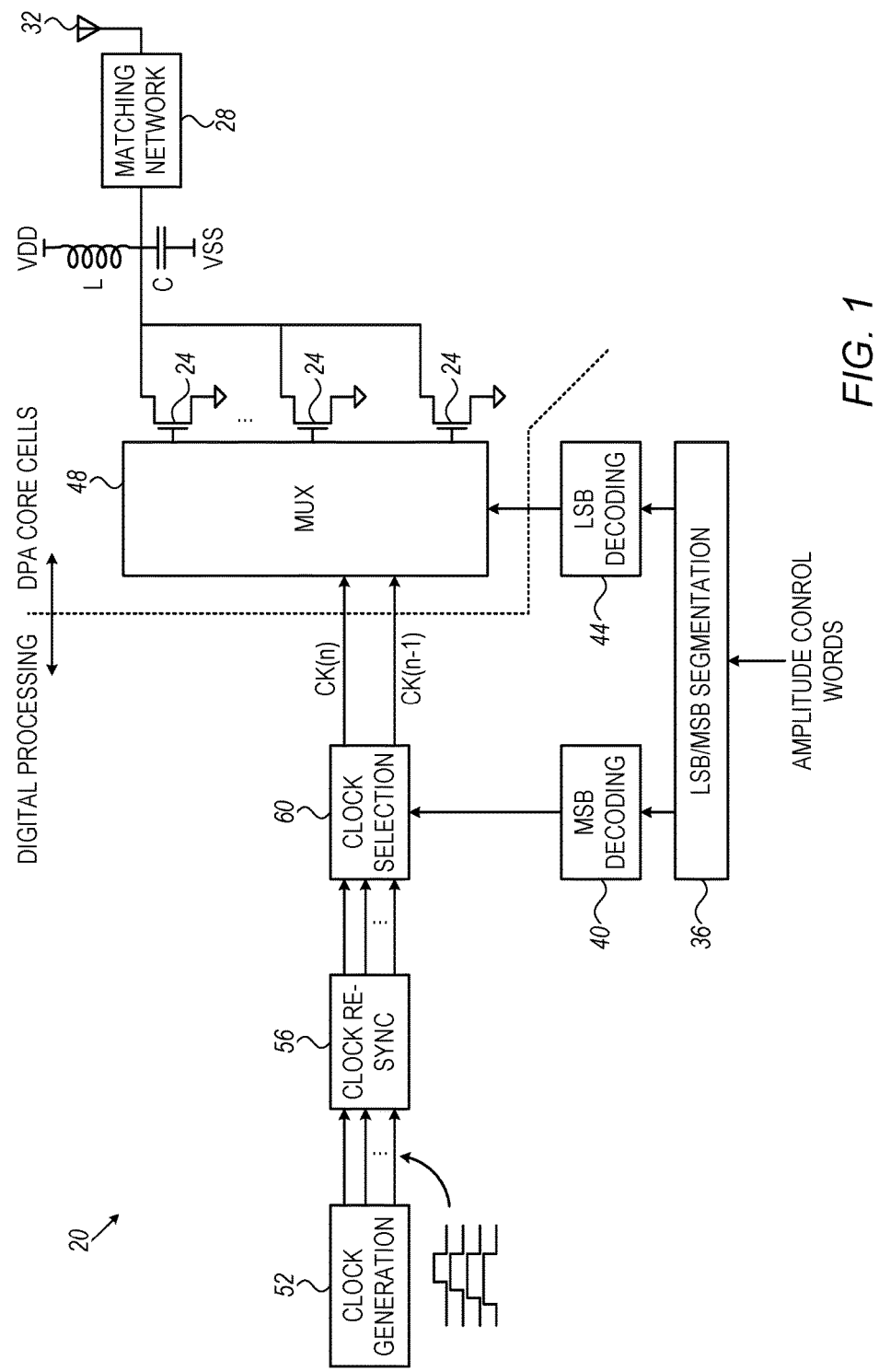
FIG. 1 is a block diagram that schematically illustrates a Digital Power Amplifier (DPA) that uses joint amplitude/duty-cycle modulation, in accordance with an embodiment that is described herein.

Embodiments that are described herein provide improved DPA designs and associated methods. In some embodiments, a DPA comprises an array of transistors whose outputs are connected in parallel to one another. The DPA further comprises digital circuitry that is configured to control the array or transistors. One possible way of controlling the instantaneous output power the DPA is to apply amplitude modulation to the transistors, e.g., by adaptively varying the number of active transistors. Another possible way of controlling the instantaneous DPA output power is to apply Pulse-Width Modulation (PWM) or duty-cycle modulation to the transistors.

Amplitude modulation and duty-cycle modulation have different advantages and disadvantages. For example, when using amplitude modulation, the composite on-resistance ($R_{ON}$) of the DPA is inversely-related to the number of active transistors, since the transistors are connected in parallel to one another. As a result, the efficiency of the DPA is degraded for small output power levels. This effect is undesired, for example, when amplifying Orthogonal Frequency Division Multiplexing (OFDM) signals or other signals having high Peak-to-Average Ratio (PAR). As another example, when using duty-cycle modulation, it is practically problematic to generate very narrow pulses. As a result, the resolution and accuracy of the modulation may be degraded at small output power levels. On the other hand, duty-cycle modulation is able to achieve high efficiency even at small output power.

In the disclosed embodiments, the digital circuitry controls the DPA using both amplitude modulation and duty-cycle modulation simultaneously, in a manner that exploits the benefits of both modulation schemes.

In some embodiments, the digital circuitry receives a sequence of control words that specify the amplitudes of the output signal to be generated in respective time intervals. For each control word, which corresponds to a respective time interval, the digital circuitry performs the following:

Partitions each control word into a Least Significant Bit (LSB) portion having a predefined number of LSBs of the control word, and a Most Significant Bit (MSB) portion having the remaining MSBs of the control word.

Selects an amplitude based on the LSB portion, and a time duration based on the MSB portion.

Activates the array of transistors in accordance with the selected time duration and the selected amplitude.

In one example embodiment, the digital circuitry sets first and second time periods within each time interval. During the first time period, which is fixed in duration, the number of active transistors is set based on the LSB portion of the control word. During the second time period, all the transistors in the array are activated, for a duration that is set based on the MSB portion of the control word. In an embodiment, the first time period immediately precedes the second time period.

Several example implementations of DPAs that use the disclosed techniques are described herein. In an example embodiment, the digital circuitry generates the appropriate first and second pulses per control word by selecting a pair of clock signals from a plurality of possible clock signals. This implementation simplifies the interface between the digital circuitry and the array of transistors, since it requires transferring only two clock signals at any given time.

The joint amplitude/duty-cycle modulation techniques described herein enable the DPA to achieve both high efficiency and high resolution, even at small output power levels. This sort of performance is especially suitable for operation at large back-off, e.g., when transmitting OFDM or other large-PAR signals. Nevertheless, the disclosed techniques are useful for transmitting various other types of signals, as well.

FIG. 1 is a block diagram that schematically illustrates a Digital Power Amplifier (DPA) that uses joint amplitude/duty-cycle modulation, in accordance with an embodiment that is described herein. DPA 20 may be used, for example, for transmitting Radio-Frequency (RF) signals in a Wireless Local Area Network (WLAN) device, e.g., WLAN station or access point, or in any other suitable device.

In some embodiments, DPA 20 receives as input a sequence of control words that specify the desired instantaneous output power (i.e., the desired amplitude of the output signal) at respective time intervals. The DPA generates a high-power Radio-Frequency (RF) output signal whose instantaneous power level, during the respective time interval, is specified by the control words. As indicated at the top of the figure, DPA 20 can be viewed as comprising a "DPA core cells" section (right-hand-side of the figure) and a "digital processing" section (left-hand-side of the figure).

In some embodiments, DPA 20 comprises a plurality of transistors 24 that generate the output signal. Transistors 24 typically comprise Metal Oxide Semiconductor Field-Effect Transistors (MOSFETs) that are configured to operate as switches, e.g., in Class D, E or F. In the present example DPA 20 comprises fifteen transistors 24. Alternatively, any other suitable number of transistors 24, or any other suitable type, can be used. As seen in the figure, the outputs (in the present example the drains) of transistors 24 are connected in parallel to one another.

The output signal generated by transistors 24 is fed into an L/C network that comprises a capacitor denoted C and an inductor denoted L, and then into a matching network 28. The output signal is typically transmitted via an antenna 32. The L/C network and matching network 28 are referred to collectively as an output network, which (i) performs impedance matching between the output of the array of transistors 24 and the input of antenna 32, and (ii) act as a low-pass filter that filters-out harmonic and other undesired high-frequency components of the output signal.

DPA 20 further comprises digital circuitry that controls transistors 24 in response to the control words. In the example of FIG. 1, the digital circuitry comprises an LSB/MSB segmentation module 36, an MSB decoding module 40, an LSB decoding module 44, a multiplexer module (MUX) 48, a clock generation module 52, a clock re-synchronization module 56, and a clock selection module 60.

Figure 2:
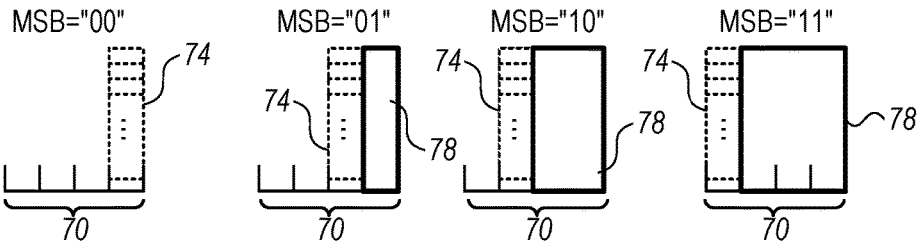
FIG. 2 is a diagram that schematically illustrates a joint amplitude/duty-cycle modulation scheme used in the DPA of FIG. 1, in accordance with an embodiment that is described herein.
Figure 3:
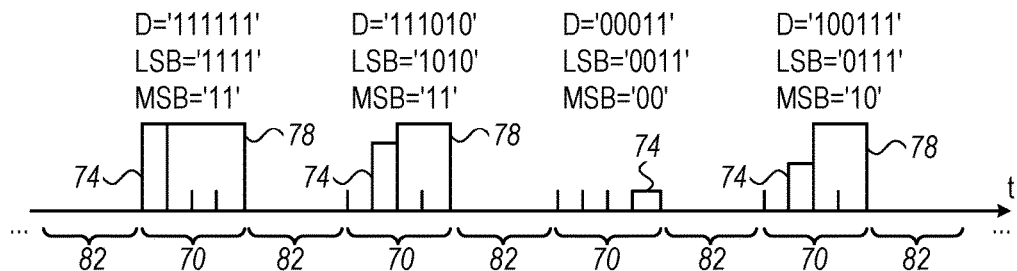
FIG. 3 is a diagram that schematically illustrates a sequence of input pulses using the joint amplitude/duty-cycle modulation scheme of FIG. 2, in accordance with an embodiment that is described herein.

In some embodiments, LSB/MSB segmentation module 36 partitions each control word into an LSB portion and an MSB portion. In various embodiments, the total number of bits per control word, and the numbers of bits in the LSB portion and MSB portion, can be set to any suitable numbers. In the embodiments of FIGS. 2 and 3 below, for example, each control word has a total of six bits, the LSB portion has four bits and the MSB portion has two bits. In an example alternative embodiment, each control word has a total of twelve bits, the LSB portion has ten bits and the MSB portion has two bits.

As will be explained and demonstrated below, the digital circuitry generates a sequence of pulses that apply joint amplitude/duty-cycle modulation to transistors 24.

In an embodiment, the LSB portion of each control word determines a corresponding pulse amplitude. In the present example, the LSB portion is decoded by LSB decoding module 44 and then used for controlling MUX 48, so as to set the number of active transistors 24. In one embodiment, MUX 48 comprises an array of multiplexers, a respective multiplexer for controlling each transistor 24. Each multiplexer in the array activates or deactivates its respective transistor 24, depending on the decoded LSB portion of the control word.

In parallel, the MSB portion of each control word determines a corresponding pulse duration. In the present example, the MSB portion is decoded by MSB decoding module 40 and then used for selecting a pair of clock signals by clock selection module 60. This joint amplitude/duty-cycle modulation scheme is explained in detail below.

In the example of FIG. 1, MUX 48 is controlled only by the LSB portion of each control word (the output of LSB decoding module 44). In alternative embodiments (e.g., an embodiment shown in FIG. 7 below), MUX 48 is also controlled by at least one of the bits of the MSB portion of the control word.

FIG. 2 is a diagram that schematically illustrates the joint amplitude/duty-cycle modulation scheme used in DPA 20, in accordance with an embodiment that is described herein. In this embodiment, the digital circuitry of DPA 20 sets two time periods in response to each control word, within a respective time interval 70.

A first time period 74, referred to as "LSB period," has a fixed duration that is equal to a quarter of time interval 70. During this period, the LSB portion of the control word determines the number of transistors 24 that are active. In the present example, the LSB portion has four bits, so as to select the number of active transistors, from zero up to the full array of fifteen transistors. In this embodiment, LSB decoding module 44 controls MUX 48 to activate and deactivate transistors 24 depending on the LSB portion.

A second time period 78, referred to as "MSB period," has a variable duration that depends on the MSB portion of the control word. In the present example, the MSB portion has two bits, and thus MSB period 78 can be set to four possible durations. FIG. 2 shows these four durations—zero for MSB="00", a quarter of interval 70 for MSB="01", a half of interval 70 for MSB="10", and three quarters of interval 70 for MSB="11". During the MSB period, all fifteen transistors 24 are active.

In the present example, the end of MSB period 78 is aligned to the end of time interval 70 for all four durations, and LSB period 74 immediately precedes MSB period 78.

FIG. 3 is a diagram that schematically illustrates the joint amplitude/duty-cycle modulation scheme of FIG. 2, in accordance with an embodiment that is described herein. The figure shows a sequence of time intervals 70, each corresponding to a respective control word. The example values of the control words (denoted "D"), and the corresponding LSB and MSB portions, are depicted next to each time interval 70.

In each time interval 70, the digital circuitry of DPA 20 configures LSB period 74 based on the LSB portion of the control word, and configures MSB period 78 based on the LSB portion of the control word. In the present example, the digital circuitry (i) sets the number of active transistors during LSB period 74 based on the LSB portion of the control word, and (ii) sets the duration of MSB period 78, during which all transistors are active, based on the MSB portion of the control word.

In an embodiment, following each time interval 70, the digital circuitry deactivates the entire array of transistors 24 for an intermediate idle period 82. Intermediate idle periods 82 allow the output network (the L/C network and matching network 28) to oscillate in response to the output signal in the preceding time interval 70.

In an example implementation in a 2.4 GHz WLAN device, the combined duration of each time interval 70 and the subsequent idle period 82 is 416 pS. In an example embodiment, although not necessarily, time interval 70 and idle period 82 have the same duration (e.g., 208 pS each in a 2.4 GHz WLAN implementation). Alternatively, time intervals 70 and idle periods 82 can be set to any other suitable durations.

In the example embodiment of FIGS. 2 and 3, LSB period 74 precedes MSB period 78 in a given time interval 70. This configuration, however, is not mandatory. In alternative embodiments, any other arrangement of LSB periods 74 and MSB periods 78 can be used. In one example embodiment, MSB period 78 precedes LSB period 74 in a given time interval 70. In yet another example embodiment, in a given time interval 70, MSB period 78 is divided into two parts (e.g., halves), such that one part of MSB period 78 precedes LSB period 74 and the other part of MSB period 78 follows LSB period 74. Furthermore, it is not mandatory that LSB period 74 and MSB period 78 be aligned to the end of time interval 70, as in the example of FIGS. 2 and 3. In alternative embodiments, LSB period 74 and MSB period 78 may be aligned to the beginning of time interval 70, for example.

Figure 4:
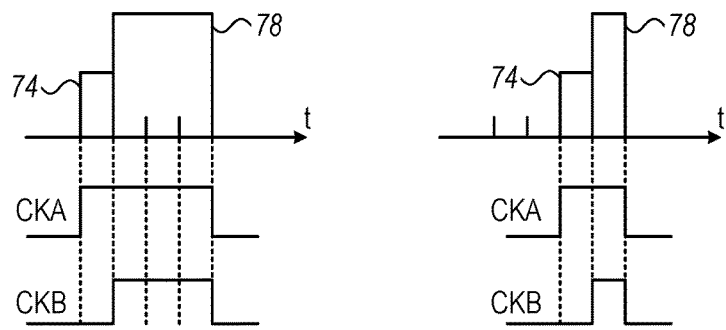
FIGS. 4 and 5 are diagrams that schematically illustrate clock signals used for carrying out the joint amplitude/duty-cycle modulation scheme of FIGS. 2 and 3, in accordance with an embodiment that is described herein.
Figure 5:
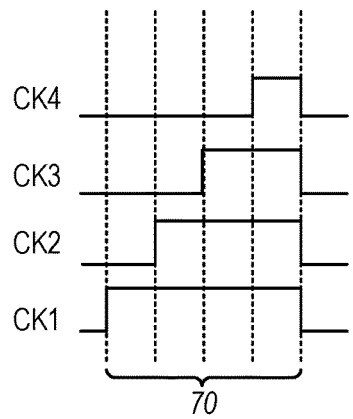

FIGS. 4 and 5 are diagrams that schematically illustrate clock signals used for carrying out the joint amplitude/duty-cycle modulation scheme of FIGS. 2 and 3, in accordance with embodiments that are described herein.

In the embodiment of FIG. 4, the digital circuitry of DPA 20 sets the timing of LSB period 74 and MSB period 78 within time interval 70 by generating two clock signals denoted CKA and CKB. The two clock signals are defined such that:

CKA is asserted during both LSB period 74 and MSB period 78, and de-asserted otherwise.

CKB is asserted only during MSB period 78, and de-asserted otherwise.

FIG. 4 shows two examples of setting the LSB period and the MSB period using these two clock signals. The two remaining possibilities of the timing of LSB period 74 and MSB period 78 (in accordance with the four possibilities of FIG. 2) are set in a similar manner.

The embodiment of FIG. 5 shows four clock signals denoted CK1, CK2, CK3 and CK4, which are used for generating all four possible timing configurations of LSB period 74 and MSB period 78 shown in FIG. 2. In this embodiment, clock generation module 52 generates the four clock signals CK1, CK2, CK3 and CK4 every time interval 70. Clock re-synchronization module 56 synchronizes the four clock signals, so that their falling edges are all aligned with one another and with the end of interval 70.

In each time interval 70, clock selection module 60 selects two successive clock signals out of the four clock signals CK1-CK4, depending on the MSB portion of the corresponding control word. The two selected clock signals (denoted CK(n−1) and CK(n) in FIG. 1, and corresponding to CKA and CKB of FIG. 4) are provided to MUX 48. In each time interval 70, MUX 48 activates transistors 24 selectively based on (i) CKA and CKB provided by clock selection module 60, and (ii) the LSB portion of the control word provided by LSB decoding module 44.

In an embodiment, in each time interval 70 MUX 48 sets LSB period 74 while only CKA (and not CKB) is asserted, and sets MSB period 78 while both CKA and CKB are asserted. During LSB period 74, MUX 48 activates only a selected number of transistors 24 depending on the LSB portion of the control word. During MSB period 78, MUX 48 activates all transistors 24, thus achieving high efficiency due to the low on-resistance ($R_{ON}$). Outside the LSB and MSB periods, MUX 48 deactivates all transistors 24. The falling edges of the two clock signals CKA and CKB are synchronized.

When using the clocking scheme of FIGS. 4 and 5, all possible timing configurations shown in FIG. 2 can be set while transferring only two clock signals to MUX 48 at any given time. This clocking scheme can be generalized to MSB portions having any suitable number of bits. In such embodiments, the total number of clock signals generated by clock generation module 52 is $2^{\#MSB}$. The number of clock signals transferred to MUX 48 at any given time, however, remains two regardless of the total number of clock signals.

This solution considerably simplifies the interface between the digital processing section and the core cells section of DPA 20. Moreover, the scheme of FIGS. 4 and 5 ensures gradual transition between the two clock signals CKA and CKB, having short and long duty cycles. This scheme also ensures monotonicity in the output power levels that in turn improves spectral purity.

Figure 6:
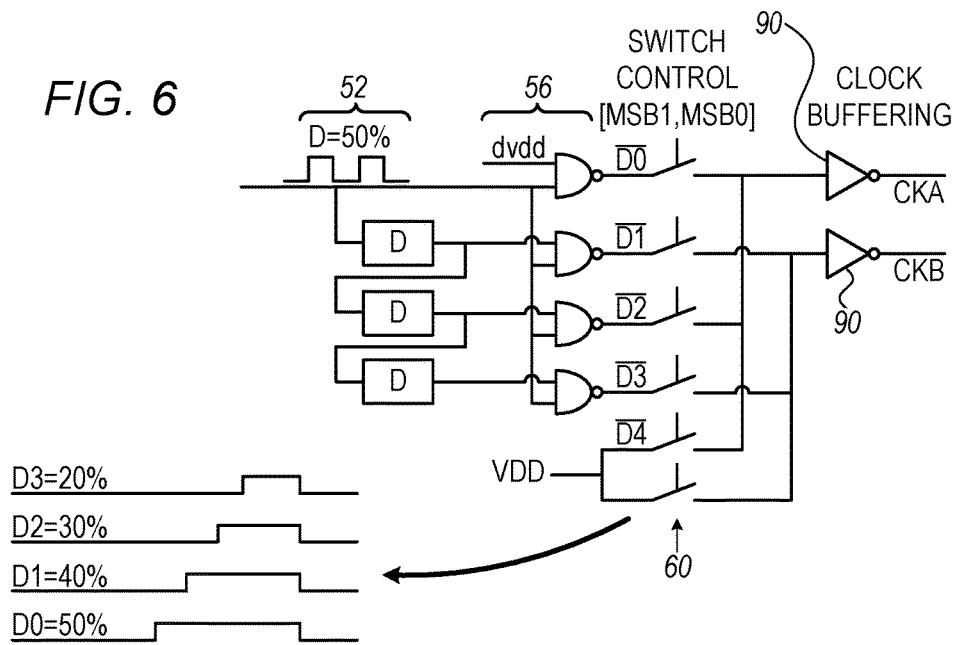
FIG. 6 is a block diagram that schematically illustrates elements of a DPA that uses joint amplitude/duty-cycle modulation, in accordance with an embodiment that is described herein.

FIG. 6 is a block diagram that schematically illustrates an example implementation of certain elements of DPA 20, in accordance with an embodiment that is described herein. In the present example, the MSB portion of each control word has two bits denoted MSB0 and MSB1, and clock selection module 60 selects clock signals CKA and CKB based on these two bits.

In the embodiment of FIG. 6, clock generation module 52 generates a reference clock signal having a duty-cycle of 50%. The reference clock signal is delayed by a cascade of three delay elements denoted "D". The reference clock signal and its three delayed replicas are input to four respective NAND gates that also serve as re-synchronization module 56. Each NAND gate performs a NAND operation between the reference clock signal and the corresponding delayed replica of the reference clock signal.

In this embodiment, the four NAND gates output four respective clock signals having duty-cycles of D0=50%, D1=40%, D2=30% and D3=20%, as shown at the bottom-left of the figure. In this manner, the four clock signals CK1-CK4 of FIG. 5 can be generated synchronously from a single reference clock signal. An additional signal denoted D4 has a duty-cycle of D4=100%.

In an embodiment, clock selection module 60 comprises suitable switches that select two of the above-described clock signals to serve as CKA and CKB. The selected clock signals are buffered in clock buffers 90, and then provided to MUX 48. In an embodiment, clock selection module 60 selects CKA and CKB depending on MSB0 and MSB1, in accordance with the following table:

TABLE 1

Clock selection example

| [MSB1, MSB0] | CKA | CKB |
|---|---|---|
| 00 | D4 | D3 |
| 01 | D2 | D3 |
| 10 | D2 | D1 |
| 11 | D0 | D1 |

In some embodiments, the digital circuitry of FIG. 6 is able to revert to a conventional control scheme, which applies only amplitude modulation and not duty-cycle modulation. Amplitude-only modulation is performed by using the reference clock signal (having D0=50% duty-cycle) as CKA, and the constant signal D4 as CKB.

Figure 7:
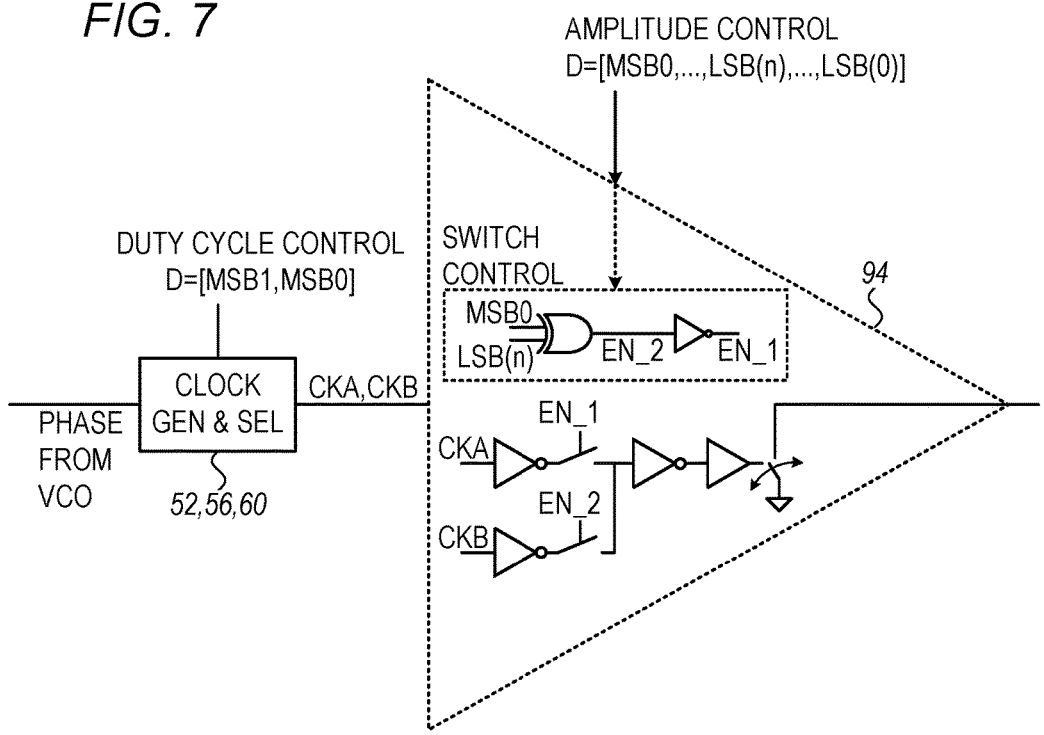
FIG. 7 is a block diagram that schematically illustrates a core amplifier cell of a DPA that uses joint amplitude/duty-cycle modulation, in accordance with an embodiment that is described herein.

FIG. 7 is a block diagram that schematically illustrates a core amplifier cell 94 of DPA 20, in accordance with an embodiment that is described herein. Each core cell 94 comprises and controls a respective transistor 24 (illustrated as a switch at the bottom-right of the figure). Core cell 94 receives the two selected clock signals CKA and CKB, and at least part of the control word D, and generates an output signal having the specified LSB period 74 and MSB period 78.

In these embodiments, in each core cell 94, the circuitry labeled "switch control" selects which clock signal (CKA or CKB) will be used for controlling transistor 24.

In one embodiment, assuming that the on-time of CKA is always longer and encompasses the on-time of CKB, the "switch control" circuitry in the $n^{th}$ core cell 94 controls transistor 24 using either CKA (when the $n^{th}$ bit of the LSB portion is "1") or CKB (when the $n^{th}$ bit of the LSB portion is "0"). In this embodiment there is no need to provide any of the MSBs to core cells 94. In such an embodiment, MUX 48 may comprise a single multiplexer that receives the set of clock signals D0-D4, and outputs CKA and CKB.

In practice, it is desirable that a clock signal having a certain duty cycle is always routed on the same path, serving either as CKA or as CKB. In FIG. 6, for example, clock signals D0, D2 and D4 are routed on the CKA path only. Clock signals D1 and D3 are routed on the CKB path only. This configuration is useful, for example, because the CKA and CKB paths are designed to have matched delays, but in practice may differ in delay due to layout non-idealities and parasitic effects. This delay mismatch may cause output non-linearity.

The description above refers mainly to embodiments in which the MSB portions of the control words are two bits in size, so that MSB portions 78 of time intervals 70 have four possible durations. This choice, however, is made solely by way of example. In alternative embodiments, the digital circuitry of the DPA may partition the control words into LSB portions and MSB portions of any other suitable sizes.

In some embodiments, the digital circuitry of DPA 20 further comprises a Digital Pre-Distortion (DPD) module (not shown in the figures). The DPD module is configured to compensate for non-linear distortion caused by various DPA elements, e.g., transistors 24 and/or elements of the digital circuitry. In one embodiment the DPD module is implemented using a Look-Up Table (LUT) that specifies amplitude and/or phase correction values to be applied to the signal. In an embodiment, some of the non-linear distortion is contributed by the joint amplitude/duty-cycle modulation scheme described herein. Typically, however, the disclosed joint amplitude/duty-cycle modulation scheme does not introduce non-linear distortion having memory effects. As such, a simple memory-less (e.g., LUT-based) DPD is typically sufficient for compensating for the non-linear distortion that might be contributed by the disclosed joint amplitude/duty-cycle modulation scheme.

The configuration of DPA 20 shown in FIG. 1, and the configurations of the DPA elements shown in FIGS. 6 and 7, are example configurations that are depicted solely for the sake of clarity. In alternative embodiments, any other suitable configurations can be used. DPA elements that are not mandatory for understanding of the disclosed techniques have been omitted from the figures for the sake of clarity.

The different elements of DPA 20 may be implemented using dedicated hardware or firmware, such as using hard-wired or programmable logic, e.g., in one or more RF Integrated Circuits (RFICs), Application-Specific Integrated Circuit (ASICs) or Field-Programmable Gate Array (FPGA).

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A power amplifier, comprising:
   an array of transistors, having outputs that are connected in parallel to one another and coupled to an output network; and
   digital circuitry, configured to receive a sequence of control words that specify respective amplitudes of a signal to be transmitted in respective time intervals, and to transmit the signal by performing, for each control word and respective time interval:
      partitioning the control word into a Least Significant Bit (LSB) portion and a Most Significant Bit (MSB) portion;
      selecting a time duration based on the MSB portion;
      selecting an amplitude based on the LSB portion; and
      activating the array of transistors during the time interval in accordance with the selected time duration and the selected amplitude.

2. The power amplifier according to claim 1, wherein the digital circuitry is configured to select the amplitude by selecting a number of the transistors to be activated, and to activate only the selected number of the transistors during at least part of the time interval.

3. The power amplifier according to claim 2, wherein, within the respective time interval, the digital circuitry is configured to:
   activate only the selected number of the transistors for a first time period having a fixed time duration; and
   activate all the transistors for a second time period having the selected time duration.

4. The power amplifier according to claim 3, wherein the digital circuitry is configured to schedule each second time period to end in accordance with a clock signal, and to schedule each first time period to immediately precede the corresponding second time period.

5. The power amplifier according to claim 1, wherein the digital circuitry is configured to select the time duration by selecting a pair of clock signals from among a plurality of clock signals.

6. The power amplifier according to claim 5, wherein the digital circuitry is configured to apply the selected amplitude while a single clock signal in the pair is asserted, and to apply the selected time duration while both clock signals in the pair are asserted.

7. The power amplifier according to claim 1, wherein the digital circuitry is configured to deactivate the array of transistors for an intermediate idle period between successive time intervals.

8. A method for power amplification, comprising:
   receiving a sequence of control words, which specify respective amplitudes of a signal to be transmitted in respective time intervals by an array of transistors having outputs that are connected in parallel to one another and coupled to an output network; and
   transmitting the signal by performing, for each control word and respective time interval:
      partitioning the control word into a Least Significant Bit (LSB) portion and a Most Significant Bit (MSB) portion;
      selecting a time duration based on the MSB portion;
      selecting an amplitude based on the LSB portion; and
      activating the array of transistors during the time interval in accordance with the selected time duration and the selected amplitude.

9. The method according to claim 8, wherein selecting the amplitude comprises selecting a number of the transistors to be activated, and wherein activating the array of transistors comprises activating only the selected number of the transistors during at least part of the time interval.

10. The method according to claim 9, wherein activating the array of transistors comprises, within the time interval:
   activating only the selected number of the transistors for a first time period having a fixed time duration; and
   activating all the transistors for a second time period having the selected time duration.

11. The method according to claim 10, wherein activating the array of transistors comprises scheduling each second time period to end in accordance with a clock signal, and scheduling each first time period to immediately precede the corresponding second time period.

12. The method according to claim 8, wherein selecting the time duration comprises selecting a pair of clock signals from among a plurality of clock signals.

13. The method according to claim 12, wherein activating the array of transistors comprises applying the selected amplitude while a single clock signal in the pair is asserted, and applying the selected time duration while both clock signals in the pair are asserted.

14. The method according to claim 8, comprising deactivating the array of transistors for an intermediate idle period between successive time intervals.

* * * * *